United States Patent
Park

(10) Patent No.: US 7,486,581 B2
(45) Date of Patent: Feb. 3, 2009

(54) CIRCUIT AND METHOD FOR CONTROLLING SENSE AMPLIFIER OF SEMICONDUCTOR MEMORY APPARATUS

(75) Inventor: Mun-Phil Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 64 days.

(21) Appl. No.: 11/637,756

(22) Filed: Dec. 13, 2006

(65) Prior Publication Data

US 2007/0247942 A1   Oct. 25, 2007

(30) Foreign Application Priority Data

Apr. 6, 2006   (KR) .................. 10-2006-0031618

(51) Int. Cl.
  *G11C 7/02* (2006.01)
  *G11C 7/00* (2006.01)
(52) U.S. Cl. .................. 365/207; 365/196; 365/203
(58) Field of Classification Search ........... 365/196, 365/203, 207
See application file for complete search history.

(56) References Cited

U.S. PATENT DOCUMENTS

| 6,380,784 B1 | 4/2002 | Jeong |
| 6,894,942 B2 | 5/2005 | Cho |
| 2002/0006050 A1* | 1/2002 | Jain .................. 365/104 |
| 2002/0109531 A1* | 8/2002 | Pyo .................. 327/51 |
| 2005/0226073 A1 | 10/2005 | Lee |
| 2006/0044904 A1 | 3/2006 | Byun |
| 2006/0215479 A1 | 9/2006 | Lee |
| 2007/0070751 A1* | 3/2007 | Byun .................. 365/205 |
| 2007/0104008 A1* | 5/2007 | Park .................. 365/222 |

FOREIGN PATENT DOCUMENTS

| JP | 60-246096 | 12/1985 |
| JP | 2062784 | 3/1990 |
| JP | 03-283088 | 12/1991 |
| JP | 2002-358778 | 12/2002 |
| KR | 1020050099774 | 10/2005 |

* cited by examiner

*Primary Examiner*—Ly D Pham
(74) *Attorney, Agent, or Firm*—Venable LLP; Jeffri A. Kaminski

(57) ABSTRACT

A circuit for controlling a sense amplifier of a semiconductor memory apparatus including a sense amplifier control unit that controls an enable point of a sense amplifier control signal which is generated by an active command and a pre-charge command, according to whether a refresh signal is enabled. A sense amplifier driver that generates a sense amplifier driving signal in response to input of the sense amplifier control signal and a bit line equalization signal.

28 Claims, 9 Drawing Sheets

CIRCUIT AND METHOD FOR CONTROLLING SENSE AMPLIFIER OF SEMICONDUCTOR MEMORY APPARATUS

CROSS-REFERENCE TO RELATED APPLICATIONS

This U.S. non-provisional patent application claims priority under 35 U.S.C. § 119 of Korean Patent Application No. 2006-031618 filed on Apr. 6, 2006, the entire contents of which are hereby incorporated by reference.

BACKGROUND OF THE INVENTION

1. Technical Field

The present invention relates to a circuit and method for controlling a sense amplifier of a semiconductor memory apparatus, and more particularly, to a circuit and method for controlling a sense amplifier of a semiconductor memory apparatus that prevents a malfunction due to lack of an operation voltage for bit line sensing during a refresh operation.

2. Related Art

In general, a DRAM (Dynamic Random Access Memory) performs a data input/output operation by sensing a pair of bit lines BL and /BL, that is, a bit line BL and a sub bit line /BL connected to a memory cell as a core voltage level Vcore and a ground voltage level VSS, respectively. In a bit line sense amplifier that performs a bit line sensing operation, a sense amplifier driving signal that applies the core voltage level is referred to as RTO, and a sense amplifier driving signal that applies the ground voltage level is referred to as SB. In order to sense a bit line of an arbitrary memory bank, it is necessary that an active command and a precharge command are input from the outside of a memory apparatus to a sense amplifier control circuit and then a sense amplifier driving signal is generated and transmitted to each sense amplifier. The sense amplifier driving signal is generated on the basis of a sense amplifier control signal. The sense amplifier control signal is a general term for an RTO enable signal and an SB enable signal, which will be described below.

In a general semiconductor memory apparatus, one-by one, a plurality of memory banks perform a bit line sensing operation during a normal operation. However, in a refresh operation, the plurality of memory banks simultaneously perform the bit line sensing operation. When a refresh signal is enabled, each area in the semiconductor memory apparatus goes into a refresh operation mode.

Hereinafter, a sense amplifier control circuit according to the related art will be described with reference to FIGS. 1 and 2.

FIG. 1 is a block diagram illustrating the structure of a circuit for controlling a sense amplifier of a semiconductor memory apparatus according to the related art.

The illustrated circuit for controlling sense amplifier includes a sense amplifier control unit 10 and a sense amplifier driver 20. The sense amplifier control unit 10 receives an active command act and a precharge command pcg and generates and outputs an RTO enable signal RTO_enb and an SB enable signal SB_enb, which are sense amplifier control signals. The sense amplifier driver 20 generates an RTO signal and an SB signal, which are sense amplifier driving signals, in response to the RTO enable signal RTO_enb, the SB enable signal SB_enb, and a bit line equalization signal bleq.

When the active command act input to the sense amplifier control unit 10 is enabled, the RTO enable signal RTO_enb and the SB enable signal SB_enb are enabled and output. The enabled states of the RTO enable signal RTO_enb and the SB enable signal SB_enb are held until the precharge command pcg is enabled.

When the bit line equalization signal bleq input to the sense amplifier driver 20 is enabled, the voltage level of the RTO signal and the SB signal is equal to the bit line precharge voltage level. However, when the bit line equalization signal bleq is disabled, the supply of the bit line precharge voltage is cut off. Thereafter, when the RTO enable signal RTO_enb is enabled, the voltage level of the RTO signal is equal to a core voltage level, and when the SB enable signal SB_enb is enabled, the voltage level of the SB signal is at the ground voltage level.

In this case, the bit line equalization signal bleq is a signal enabled by the precharge command pcg. The bit line equalization signal bleq is disabled in an active mode and enabled in a precharge mode.

The RTO signal and the SB signal generated by the sense amplifier driver 20 are transmitted to a sense amplifier and convert the voltage levels of a pair of bit lines BL and /BL into the bit line precharge voltage level in the precharge mode and into the core voltage level and the ground voltage level in the active mode, respectively.

FIG. 2 is a graph that explains a bit line sensing operation according to the related art and illustrates a process in which the bit line BL and the sub bit line /BL are sensed as the level of the core voltage Vcore and the level of the ground voltage VSS, respectively.

In FIG. 2, a variation in the voltage levels of the pair of bit lines BL and /BL during the bit line sensing operation of the sense amplifier is shown. When a word line WL is enabled after the active command act is enabled, the bit line sensing operation starts. Thereafter, when sense amplifier control signals ctrl, that is, the RTO enable signal RTO_enb and the SB enable signal SB_enb, are enabled, a voltage difference between the pair of bit lines BL and /BL is amplified. When the voltage difference between the pair of bit lines BL and /BL is amplified to at least a predetermined level, it is possible to perform a read or write operation in a memory cell. When the precharge command pcg is enabled after a predetermined time has elapsed, the pair of bit lines BL and /BL are precharged to have a voltage level of Vcore/2. In FIG. 2, the bit line sensing process for only one period is illustrated.

As described above, in the refresh operation, all the sense amplifiers provided to a plurality of memory banks simultaneously perform the bit line sensing operation. Therefore, the driving power of the sense amplifier is lower than a normal operation in which only one memory bank is operated. As a result, the voltage difference between the pair of bit lines BL and /BL is smaller or is amplified later, as compared to the normal operation. When the voltage difference between the pair of bit lines BL and /BL is not amplified to the predetermined level, a malfunction can occur in the read or write operation of a memory cell. The bit line sensing process in the refresh operation is the same as shown by dotted lines (A) in FIG. 2.

In order to improve the driving power of the sense amplifier, an initial voltage difference dV between the pair of bit lines BL and /BL should be a predetermined level or more from after the word line WL is enabled to before the sense amplifier control signal ctrl is enabled. In the refresh operation in which the driving power of the sense amplifier decreases, an initial time for a bit line sensing operation longer than that in the normal operation is required in order to ensure the initial voltage difference dV of the predetermined level or more. However, in the related art, since the initial voltage difference dV is not sufficiently ensured in the refresh operation, the potential difference between the pair of bit lines BL and /BL is not sufficiently amplified. Therefore, a malfunction may occur in the read or write operation of the memory cell.

SUMMARY OF THE INVENTION

Embodiments of the present invention provide a circuit and method for controlling a sense amplifier of a semiconductor memory apparatus which prevent a malfunction due to lack of an operation voltage for the bit line sensing.

An embodiment of the present invention provides a sense amplifier control circuit for a semiconductor memory apparatus including: a sense amplifier control unit configured to control an enable point of a sense amplifier control signal which is generated by an active command and a precharge command, according to whether a refresh signal is enabled; and a sense amplifier driver configured to generate a sense amplifier driving signal in response to input of the sense amplifier control signal and a bit line equalization signal.

Another embodiment of the present invention provides a method for controlling a sense amplifier of a semiconductor memory apparatus. The method including: controlling an enable point of a sense amplifier control signal which is generated by the input of an active command and a precharge command, according to whether a refresh signal is enabled; and generating a sense amplifier driving signal in response to the input of the sense amplifier control signal and a bit line equalization signal.

DESCRIPTION OF EXEMPLARY EMBODIMENT

Embodiments of the present invention will now be described in detail with reference to the accompanying drawings.

Figure 1:
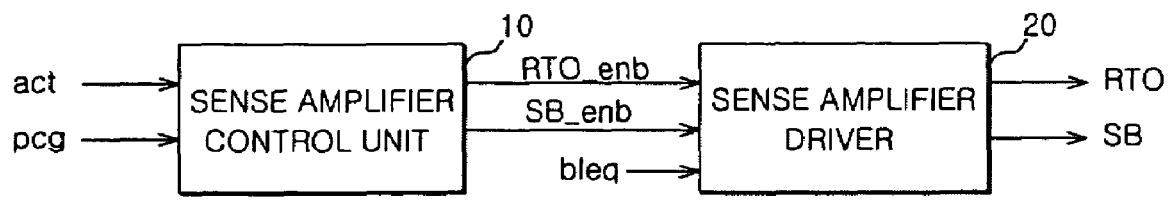
FIG. 1 is a block diagram illustrating the structure of a circuit for controlling a sense amplifier of a semiconductor memory apparatus according to the related art.
Figure 2:
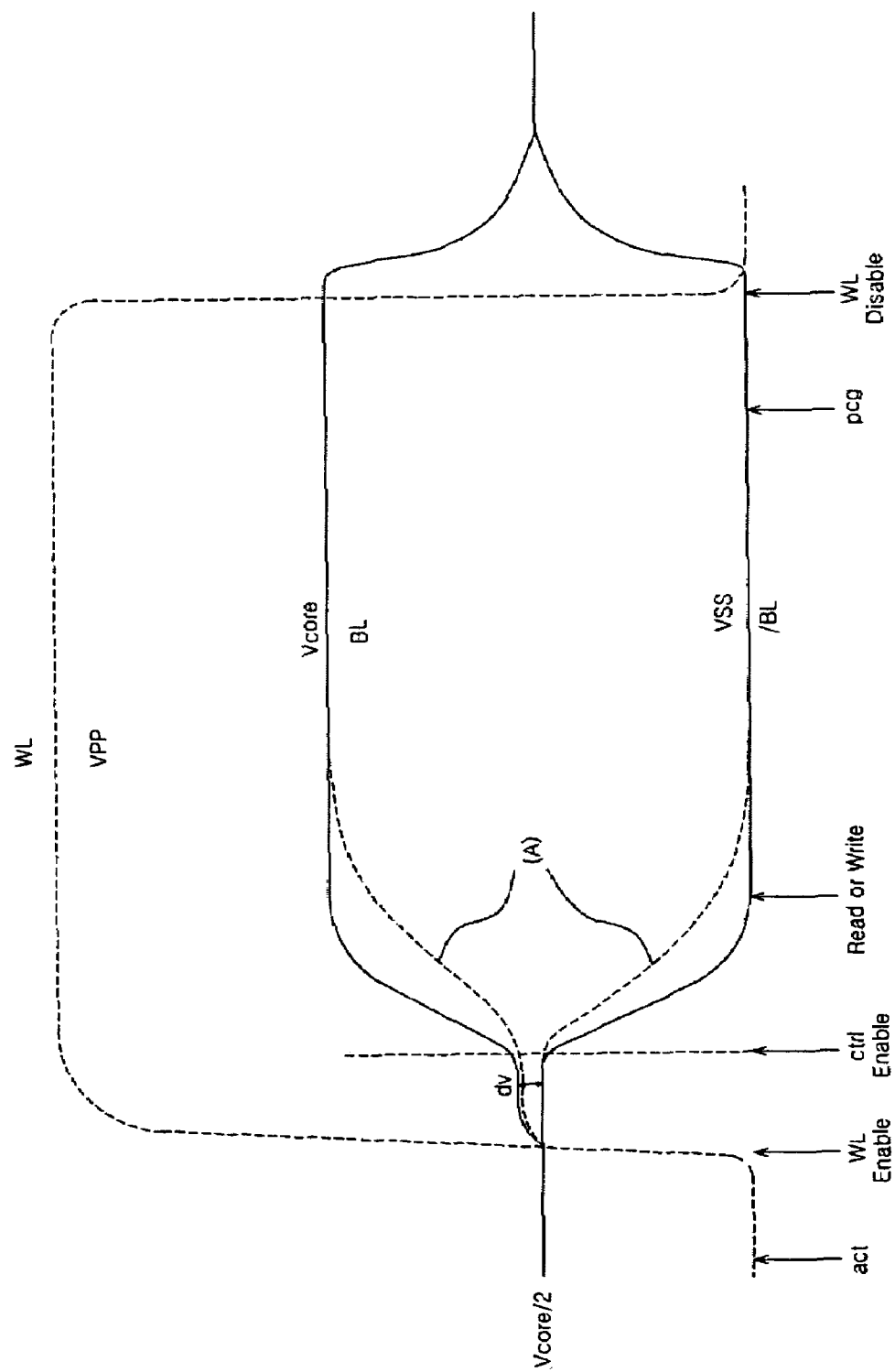
FIG. 2 is a graph that illustrates a bit line sensing operation according to the related art.
Figure 3:
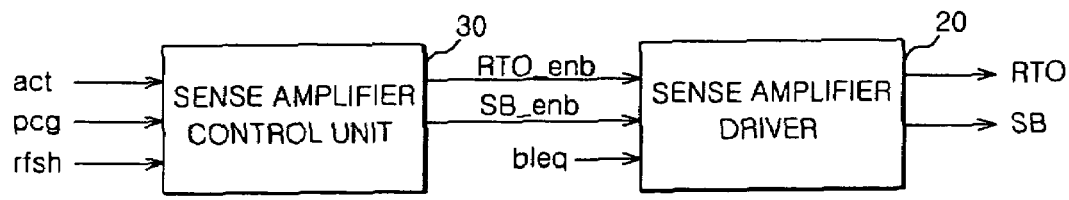
FIG. 3 is a block diagram illustrating the structure of a circuit for controlling a sense amplifier of a semiconductor memory apparatus according to an embodiment of the present invention.

FIG. 3 is a block diagram illustrating the structure of a circuit for controlling a sense amplifier of a semiconductor memory apparatus according to an embodiment of the present invention.

As shown in FIG. 3, the circuit for controlling a sense amplifier includes a sense amplifier control unit 30 and a sense amplifier driver 20. The sense amplifier control unit 30 controls the enable point of an RTO enable signal RTO_enb or an SB enable signal SB_enb, which are generated by the input of an active command act and a precharge command pcg, corresponding to whether a refresh signal rfsh is enabled. The sense amplifier driver 20 generates an RTO signal RTO and an SB signal SB corresponding to the input of the RTO enable signal RTO_enb, the SB enable signal SB_enb, and a bit line equalization signal bleq.

FIG. 3 illustrates a case of using both the RTO enable signal RTO_enb and the SB enable signal SB_enb as sense amplifier control signals input to the sense amplifier driver 20. The RTO enable signal RTO_enb is for converting the voltage level of the RTO signal RTO into a core voltage level. The SB enable signal SB_enb is for converting the voltage level of the SB signal SB into a ground voltage level. The refresh signal rfsh is enabled in a refresh mode.

During a normal operation of the semiconductor memory apparatus, when the active command act input to the sense amplifier control unit 30 is enabled, the RTO enable signal RTO_enb and the SB enable signal SB_enb are enabled. The enabled states of the RTO enable signal RTO_enb and the SB enable signal SB_enb are held until the precharge command pcg is enabled. However, in a refresh operation of the semiconductor memory apparatus, when the active command act is enabled, the RTO enable signal RTO_enb or the SB enable signal SB_enb is delayed by a predetermined amount of time and is then enabled. There are various methods of delaying the enable point of the RTO enable signal RTO_enb or the SB enable signal SB_enb, and a description thereof will be made below with reference to the drawings.

When the bit line equalization signal bleq input to the sense amplifier driver 20 is enabled, the voltage levels of the RTO signal and the SB signal are at the bit line precharge voltage levels. However, when the bit line equalization signal bleq is disabled, the supply of the bit line precharge voltage is cut off. Thereafter, when the RTO enable signal RTO_enb is enabled, the voltage level of the RTO signal is at the core voltage level, and when the SB enable signal SB_enb is enabled, the voltage of the SB signal is at the ground voltage level.

The RTO signal and the SB signal generated by the sense amplifier driver 20 are transmitted to a sense amplifier so as to convert the voltage levels of a pair of bit lines BL and /BL into precharge voltage levels in a precharge mode and into the core voltage level and the ground voltage level in an active mode, respectively.

Figure 4:
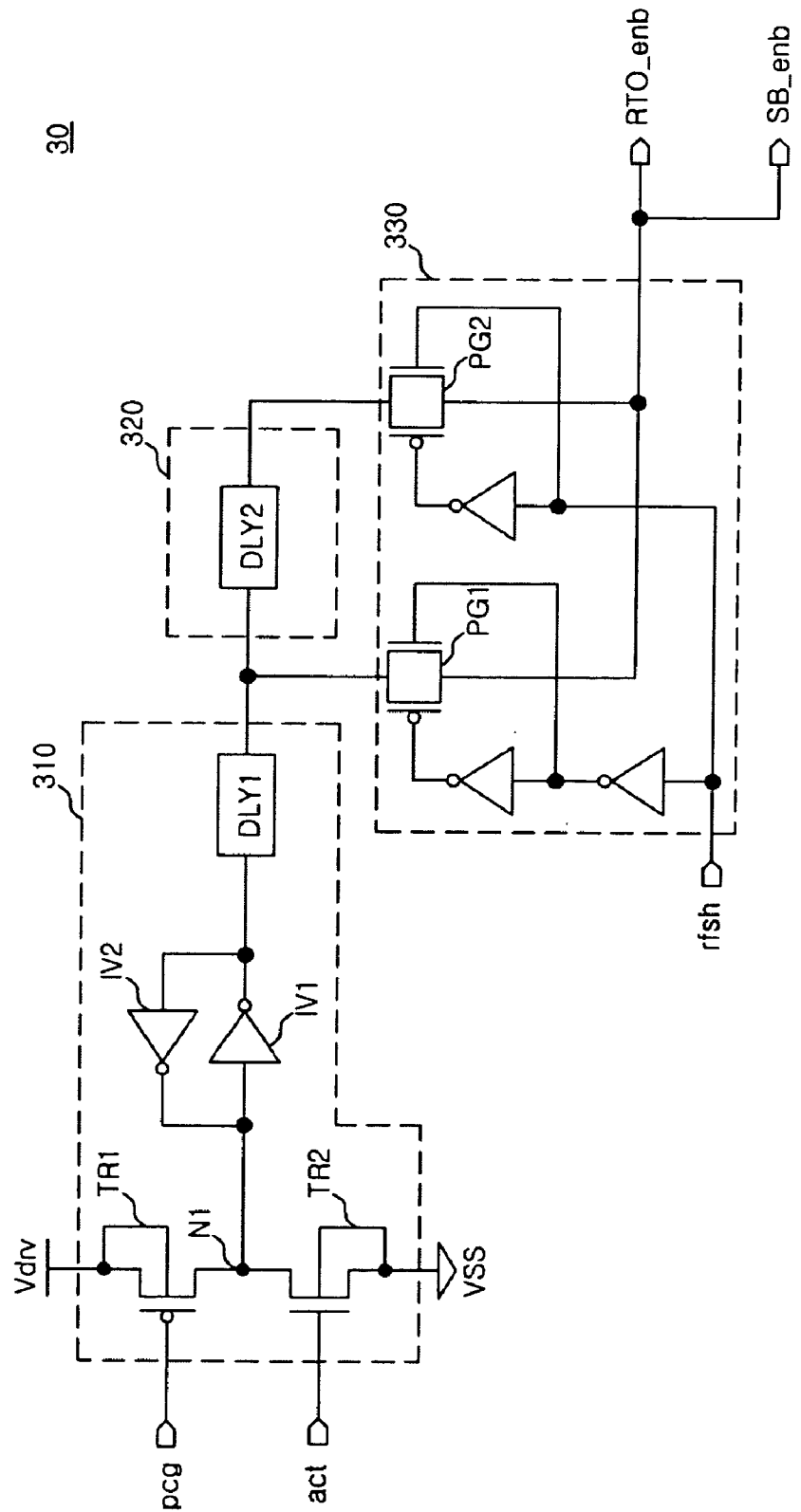
FIG. 4 is a circuit diagram illustrating the detailed circuit structure of a first embodiment of the sense amplifier control unit illustrated in FIG. 3.

FIG. 4 is a circuit diagram illustrating the detailed circuit of a first embodiment of the sense amplifier control unit illustrated in FIG. 3, which simultaneously delays the enable points of the RTO enable signal and the SB enable signal in the refresh mode.

The illustrated sense amplifier control unit 30 includes: a signal generating section 310 that drives, latches, and delays a driving voltage Vdrv in response to the input of the active command act and the precharge command pcg; a first delay section 320 that delays an output signal of the signal generating section 310 by a predetermined amount of time; and a first switching section 330 that selects the output signal of the signal generating section 310 or the output signal of the first delay section 320 according to whether the refresh signal rfsh is enabled, and outputs the selected signal as the RTO enable signal RTO_enb and the SB enable signal SB_enb.

In the sense amplifier control unit 30, the signal generating section 310 includes: a first transistor TR1 having a gate terminal receiving the precharge command pcg, a source terminal applied with the driving voltage Vdrv, and a drain terminal coupled with a first node N1; a second transistor TR2 having a gate terminal receiving the active command act, a drain terminal coupled with the first node N1, and a source terminal grounded; a latch unit having first and second inverters IV1 and IV2 that invert and latch a signal transmitted from the first node N1; and a first delay element DLY1 that delays the signal output by the latch unit by a predetermined amount of time.

The first delay section 320 includes a second delay element DLY2 that delays the output signal of the signal generating section 310 by a predetermined amount of time.

The first switching section 330 includes: a first pass gate PG1 that outputs the output signal of the signal generating section 310 as the RTO enable signal RTO_enb and the SB enable signal SB_enb when the refresh signal rfsh is disabled; and a second pass gate PG2 that outputs the output signal of the first delay section 320 as the RTO enable signal RTO_enb and the SB enable signal SB_enb when the refresh signal rfsh is enabled.

In this case, the driving voltage Vdrv may include, for example, an external power supply VDD, but is not limited thereto. The active command act is a high enable signal and the precharge command pcg is a low enable signal. The active command act and the precharge command pcg should not be enabled at the same time.

In the sense amplifier control unit 30 having the above-mentioned structure, when the active command act input to the signal generating section 310 is enabled, the voltage level of the first node N1 is changed to a low level. Thereafter, the low level voltage applied to the first node N1 is inverted and latched by the first and second inverters IV1 and IV2, whereby an output signal of the first inverter IV1 holds a high level voltage even after the active command act is disabled. Thereafter, the first delay element DLY1 delays the output signal of the first inverter IV1 by a predetermined amount of time.

Then, the second delay element DLY2 of the first delay section 320 further delays the output signal of the first delay element DLY1 by a predetermined amount of time.

When the refresh signal rfsh is disabled, in the first switching section 330, the first pass gate PG1 is turned on and the second pass gate PG2 is turned off. Therefore, the output signal of the signal generating section 310 is output as the RTO enable signal RTO_enb and the SB enable signal SB_enb. Meanwhile, when the refresh signal rfsh is enabled, the first pass gate PG1 is turned off and the second pass gate PG2 is turned on, whereby the output signal of the first delay section 320 is output as the RTO enable signal RTO_enb and the SB enable signal SB_enb.

When the precharge command pcg is enabled, the voltage level of the first node N1 of the signal generating section 310 is changed to the high level. In this case, the voltage applied to the first node N1 is inverted and latched by the first and second inverters IV1 and IV2 and is then transmitted to the first delay element DLY1 as a signal having a low level voltage. Accordingly, both the output signal of the first delay element DLY1 and the output signal of the second delay element DLY2 of the first delay unit 320 become a low level. In this case, regardless of whether the refresh signal rfsh is enabled, the RTO enable signal RTO_enb and the SB enable signal SB_enb are disabled.

From the above description, it can be understood that the enable points of the RTO enable signal RTO_enb and the SB enable signal SB_enb when the refresh signal rfsh is enabled are later than the enable points of the RTO enable signal RTO_enb and the SB enable signal SB_enb when the refresh signal rfsh is disabled. This operation provides additional a time to ensure an initial voltage difference dV between the pair of bit lines in a bit line sensing process during the refresh operation. When the initial voltage difference dV is sufficient, it is possible to prevent a malfunction during the bit line sensing process, as illustrated in FIG. 5.

Figure 5:
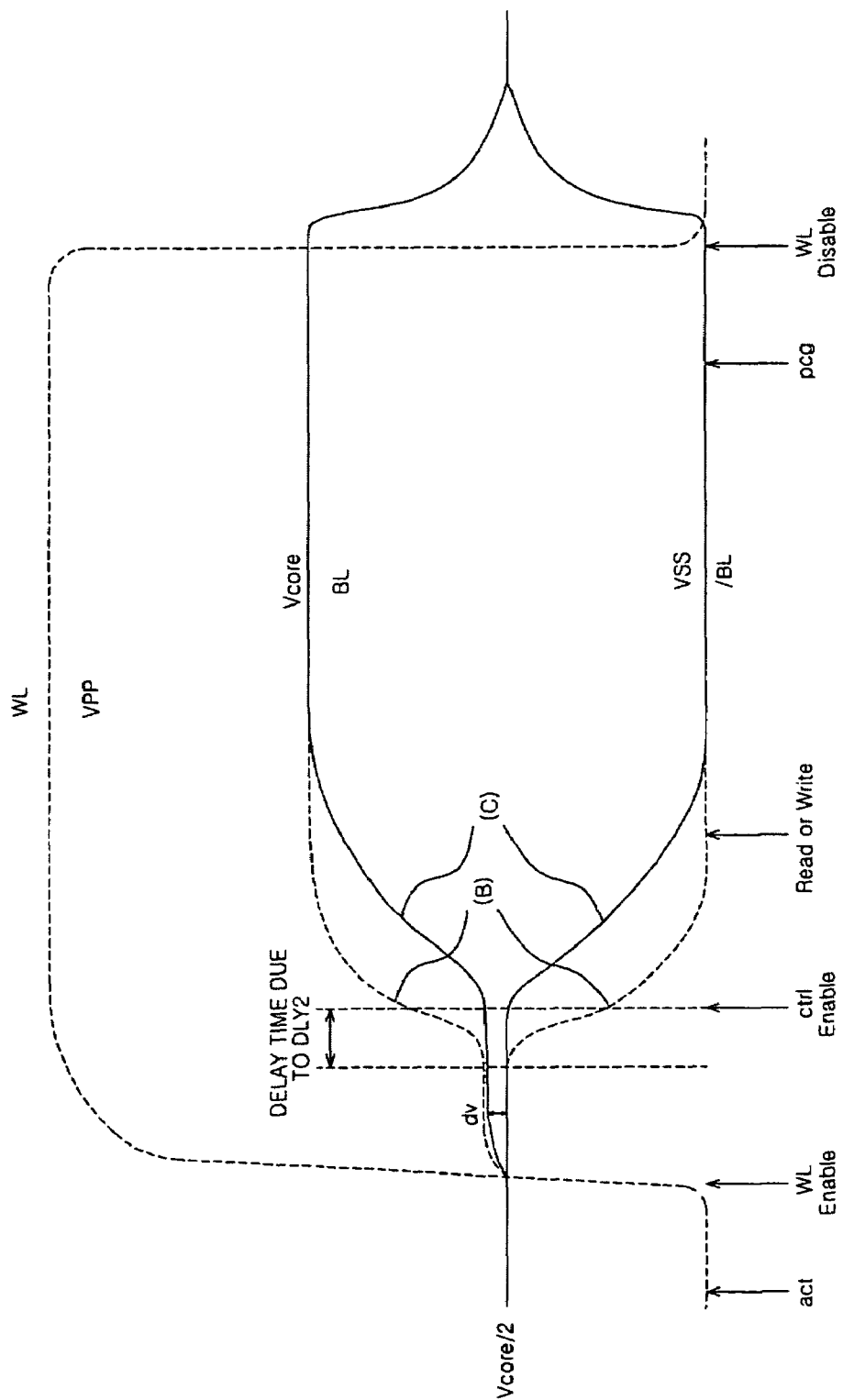
FIG. 5 is a graph that illustrates a bit line sensing operation performed by the sense amplifier control unit illustrated in FIG. 4.

FIG. 5 is a graph that illustrates the bit line sensing operation performed by the sense amplifier control unit illustrated in FIG. 4. More specifically, FIG. 5 illustrates a process in which the bit line BL and the sub bit line /BL are sensed as a core voltage level Vcore and a ground voltage level VSS, respectively.

The voltage levels of the pair of bit lines BL and /BL, shown as dotted lines (B), represent the variation in the voltage levels of the pair of bit lines BL and /BL during a normal operation, and the solid lines (C) represent the variation in the voltage levels of the pair of bit lines BL and /BL in the refresh operation.

In the refresh operation, when the active command act is enabled and then a word line WL is enabled, the bit line sensing operation starts. In this case, the initial voltage difference dV between the pair of bit lines BL and /BL in the refresh operation is smaller than during a normal operation. In order to solve this problem, in the refresh operation, the enable points of the sense amplifier control signals ctrl, that is, the RTO enable signal RTO_enb and the SB enable signal SB_enb, are delayed more than in the normal operation. The delay times of the enable points of the sense amplifier control signals ctrl are determined by the second delay element DLY2 of the first delay section 320. When the sense amplifier control signals ctrl are enabled, the voltage difference between the pair of bit lines BL and /BL is amplified. When the voltage difference is amplified to at least a predetermined level, it is possible to perform a read or write operation in the memory cells. After a predetermined time elapses, when the precharge command pcg is enabled, the pair of bit lines BL and /BL are precharged to the voltage level of Vcore/2. In FIG. 5, the bit line sensing process for only one period is illustrated.

Figure 6:
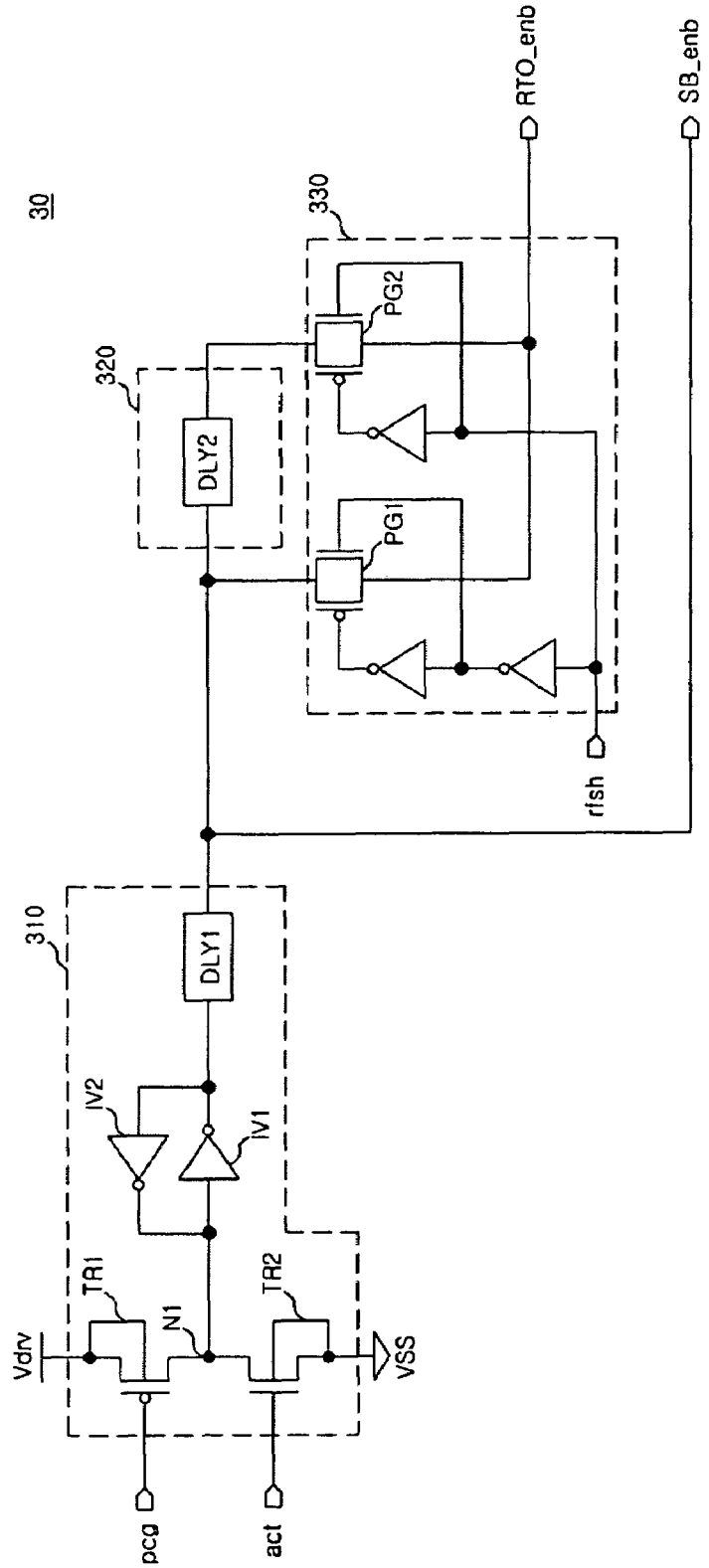
FIG. 6 is a circuit diagram illustrating the detailed circuit structure of a second embodiment of the sense amplifier control unit illustrated in FIG. 3.

FIG. 6 is a circuit diagram illustrating the detailed circuit structure of a second embodiment of the sense amplifier control unit illustrated in FIG. 3, which delays only the enable point of the RTO enable signal in the refresh mode.

The illustrated sense amplifier control unit 30 includes: a signal generating section 310 that drives, latches, and delays the driving voltage Vdrv in response to the input of the active command act and the precharge command pcg and outputs the result as the SB enable signal SB_enb; a first delay section 320 that delays the SB enable signal SB_enb by a predetermined amount of time; and a first switching section 330 that selects the SB enable signal SB_enb or an output signal of the first delay section 320 according to whether the refresh signal rfsh is enabled, and outputs the selected signal as the RTO enable signal RTO_enb.

In this sense amplifier control unit 30, the signal generating section 310 includes: a first transistor TR1 having a gate terminal receiving the precharge command pcg, a source terminal applied with the driving voltage Vdrv, and a drain terminal coupled with a first node N1; a second transistor TR2 having a gate terminal receiving the active command act, a drain terminal coupled with the first node N1, and a source terminal grounded; a latch unit having first and second inverters IV1 and IV2 that invert and latch a signal transmitted from the first node N1; and a first delay element DLY1 that delays the signal output by the latch unit by a predetermined amount of time, and outputs the delayed signal as the SB enable signal SB_enb.

The first delay section 320 includes a second delay element DLY2 that delays the SB enable signal SB_enb by a predetermined amount of time.

The first switching section 330 includes: a first pass gate PG1 that outputs the SB enable signal SB_enb as the RTO enable signal RTO_enb when the refresh signal rfsh is disabled; and a second pass gate PG2 that outputs an output signal of the first delay section 320 as the RTO enable signal RTO_enb when the refresh signal rfsh is enabled.

In the sense amplifier control unit 30 having the above-mentioned structure, when the active command act input to the signal generating section 310 is enabled, the voltage of the first node N1 is changed to a low level. Thereafter, a low level voltage applied to the first node N1 is inverted and latched by the first and second inverters IV1 and IV2, whereby an output signal of the first inverter IV1 is maintained at a high level even after the active command act is disabled. Thereafter, the first delay element DLY1 delays the output signal of the first inverter IV1 by a predetermined amount of time.

Then, the second delay element DLY2 of the first delay section 320 further delays the SB enable signal SB_enb output from the first delay element DLY1 by a predetermined amount of time.

When the refresh signal rfsh is disabled, in the first switching section 330, the first pass gate PG1 is turned on and the second pass gate PG2 is turned off. Therefore, the SB enable signal SB_enb is output as the RTO enable signal RTO_enb. Meanwhile, when the refresh signal rfsh is enabled, the first pass gate PG1 is turned off and the second pass gate PG2 is turned on, whereby the output signal of the first delay section 320 is output as the RTO enable signal RTO_enb.

When the precharge command pcg is enabled, the voltage level of the first node N1 of the signal generating section 310 is changed to the high level. In this case, the voltage applied to the first node N1 is inverted and latched by the first and second inverters IV1 and IV2 and is then transmitted to the first delay element DLY1 as a signal having a low level voltage. Accordingly, both the SB enable signal SB_enb output from the first delay element DLY1 and the output signal of the second delay element DLY2 of the first delay section 320 become a low level. In this case, regardless of whether the refresh signal rfsh is enabled, the RTO enable signal RTO_enb and the SB enable signal SB_enb are disabled.

From the above description, it can be understood that the enable point of the RTO enable signal RTO_enb when the refresh signal rfsh is enabled is later than the enable point of the RTO enable signal RTO_enb when the refresh signal rfsh is disabled. This operation provides additional time to ensure the initial voltage difference dV between the pair of bit lines in the bit line sensing process during the refresh operation. In this way, it is possible to ensure a sufficient initial voltage difference dV by delaying only the RTO enable signal RTO_enb. When the initial voltage difference dV is sufficient, it is possible to prevent a malfunction during the bit line sensing process, as illustrated in FIG. 7.

Figure 7:
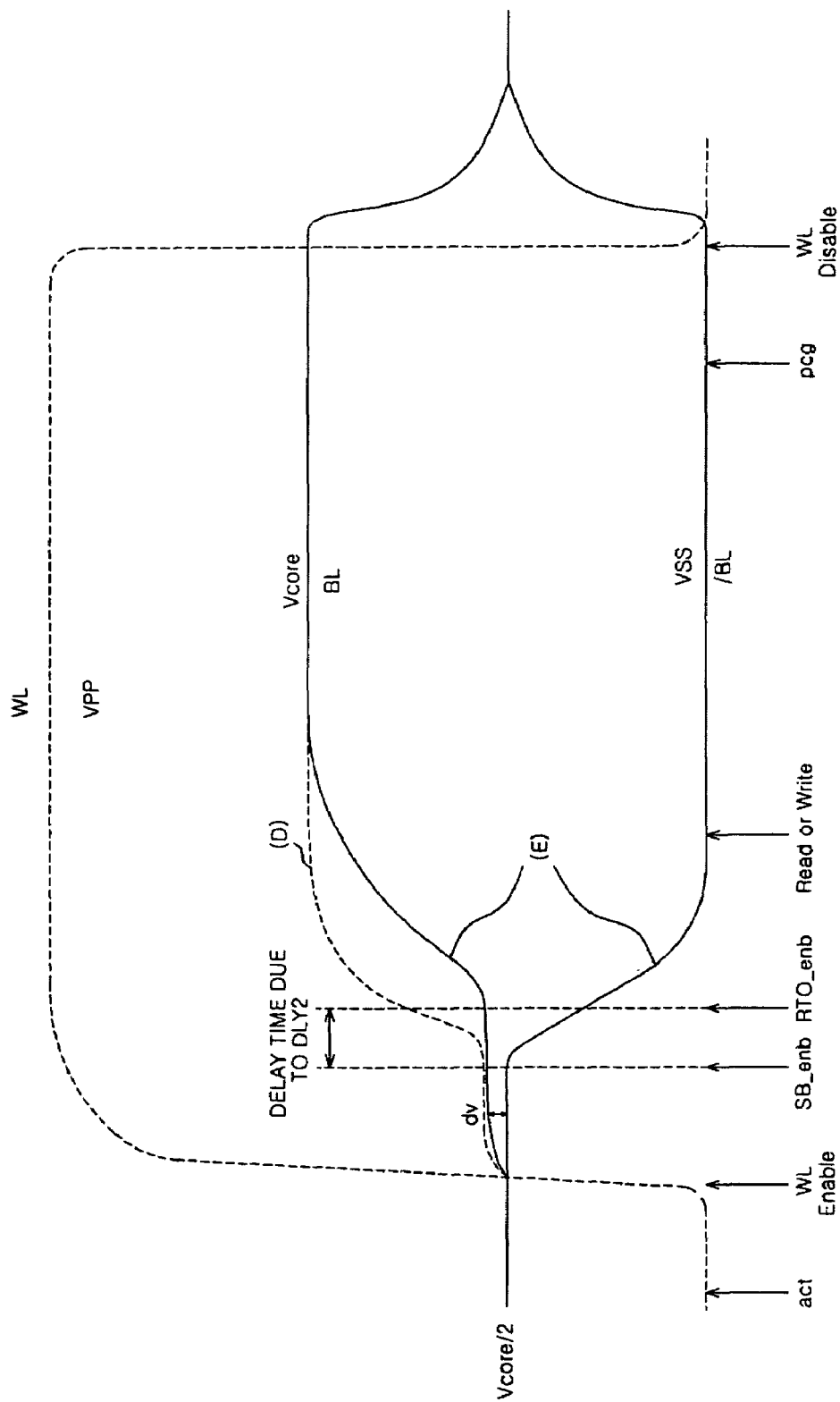
FIG. 7 is a graph that illustrates a bit line sensing operation performed by the sense amplifier control unit illustrated in FIG. 6.

FIG. 7 is a graph that illustrates the bit line sensing operation performed by the sense amplifier control unit illustrated in FIG. 6. More specifically, FIG. 7 illustrates a process in which the bit line BL and the sub bit line /BL are sensed as a core voltage Vcore level and a ground voltage VSS level, respectively.

The voltage levels of the pair of bit lines BL and /BL, shown as dotted line (D) represent the variation in the voltage level of the bit line BL during a normal operation, and solid lines (E) represent the variation in the voltage levels of the pair of bit lines BL and /BL during the refresh operation.

In the refresh operation, when the active command act is enabled and then a word line WL is enabled, the bit line sensing operation starts. In this case, the initial voltage difference dV between the pair of bit lines in the refresh operation is smaller than that during a normal operation. In order to solve this problem, in the refresh operation, the enable point of the RTO enable signal RTO_enb is delayed more than in the normal operation. The delay time of the enable point of the RTO enable signal RTO_enb is determined by the second delay element DLY2 of the first delay section 320. When the SB enable signal SB_enb is enabled, the voltage difference between the pair of bit lines BL and /BL is amplified. Thereafter, when the RTO enable signal RTO_enb is enabled, the voltage difference between the pair of bit lines BL and /BL is further amplified. When the voltage difference is amplified to a predetermined level or more, it is possible to perform a read or write operation in the memory cells. After a predetermined time elapses, when the precharge command pcg is enabled, the pair of bit lines BL and /BL are precharged to the voltage level of Vcore/2. In FIG. 7, the bit line sensing process for only one period is illustrated.

Figure 8:
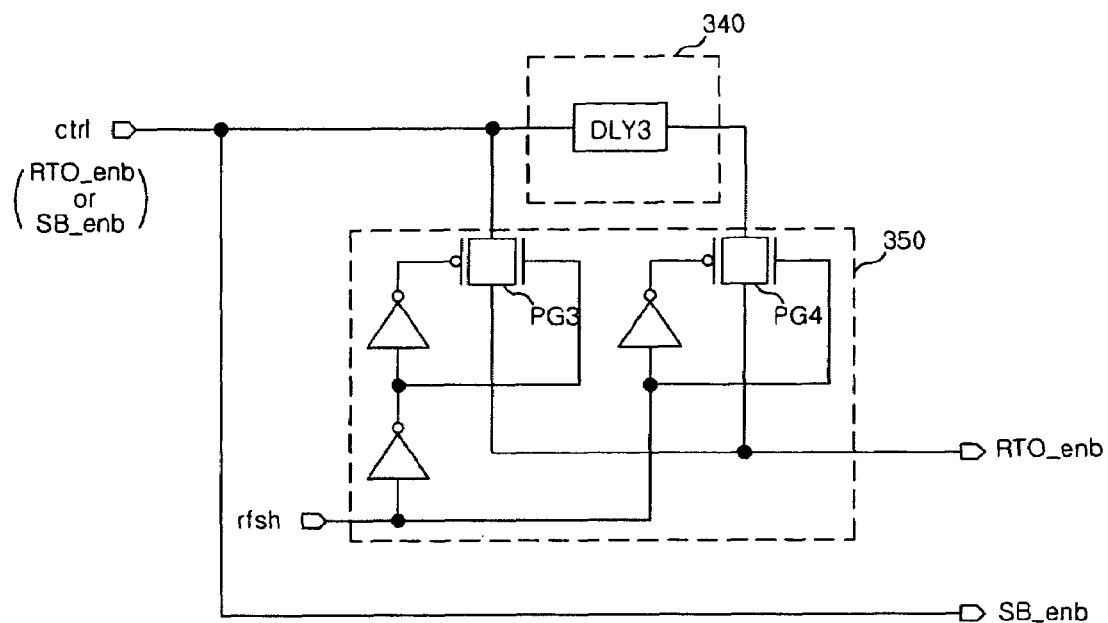
FIG. 8 is a circuit diagram illustrating the detailed circuit structure of a third embodiment of the sense amplifier control unit illustrated in FIG. 3.

FIG. 8 is a circuit diagram illustrating the detailed circuit structure of a third embodiment of the sense amplifier control unit illustrated in FIG. 3, which controls a sense amplifier control signal delayed by an additional predetermined amount of time such that an enable point of an RTO enable signal is later than an enable point of an SB enable signal. The structure of the circuit for generating the sense amplifier control signal delayed by a predetermined amount of time is the same as that of the sense amplifier control unit illustrated in FIG. 4, and thus only the structure of the circuit for controlling the generated sense amplifier control signal is illustrated in FIG. 8.

The illustrated sense amplifier control unit 30 includes: a second delay section 340 that delays the sense amplifier control signal ctrl by a predetermined amount of time; and a second switching section 350 that selects the sense amplifier control signal ctrl or an output signal of the second delay section 340 according to whether the refresh signal rfsh is enabled, and outputs the selected signal as the RTO enable signal RTO_enb.

In this case, the sense amplifier control signal ctrl is output as the SB enable signal SB_enb.

The second delay section 340 includes a third delay element DLY3 that delays the sense amplifier control signal ctrl by a predetermined amount of time.

The second switching section 350 includes: a third pass gate PG3 that outputs the sense amplifier control signal ctrl as the RTO enable signal RTO_enb when the refresh signal rfsh is disabled; and a fourth pass gate PG4 that outputs an output signal of the second delay section 340 as the RTO enable signal RTO_enb when the refresh signal rfsh is enabled.

As described above, the enable point of the sense amplifier control signal ctrl input to the sense amplifier control unit 30 in the refresh mode is later than in the normal mode.

When the refresh signal rfsh is disabled, in the second switching section 350, the third pass gate PG3 is turned on and the fourth pass gate PG4 is turned off. Therefore, the sense amplifier control signal ctrl is output as the RTO enable signal RTO_enb and the SB enable signal SB_enb. Meanwhile, when the refresh signal rfsh is enabled, the third pass gate PG3 is turned off and the fourth pass gate PG4 is turned on, whereby the sense amplifier control signal ctrl is output as the SB enable signal SB_enb and the output signal of the second delay section 340 is output as the RTO enable signal RTO_enb.

If the sense amplifier control signal ctrl, which is delayed more in the refresh mode than in the normal mode, is controlled such that the enable point of the RTO enable signal RTO_enb is later than the enable point of the SB enable signal SB_enb, it is possible to more stably perform the bit line sensing operation. A bit line sensing process in this case is illustrated in FIG. 9.

Figure 9:
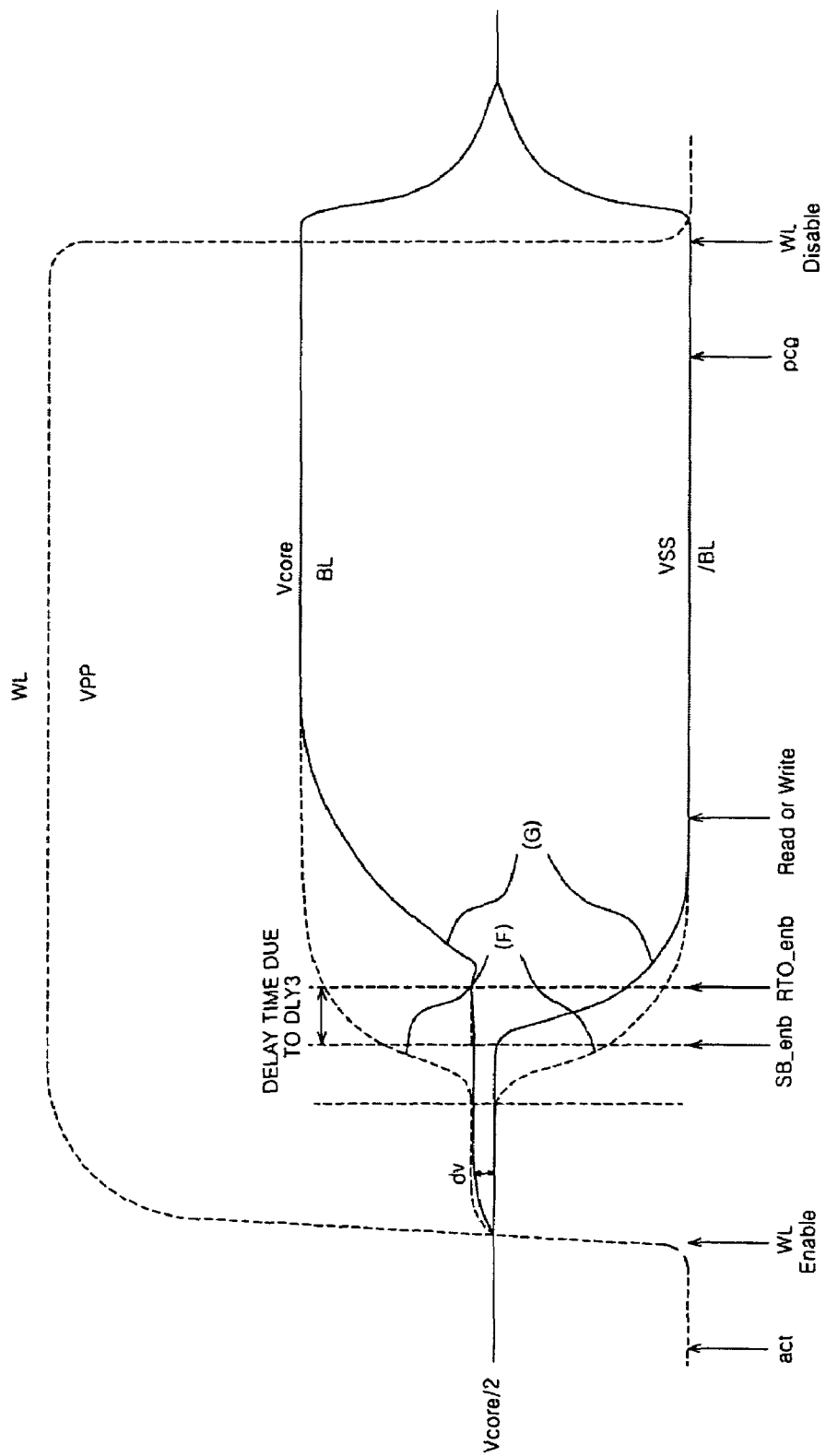
FIG. 9 is a graph that explains a bit line sensing operation performed by the sense amplifier control illustrated in FIG. 8.

FIG. 9 is a graph that explains the bit line sensing operation performed by the sense amplifier control unit illustrated in FIG. 8. More specifically, FIG. 9 illustrates a process in which the bit line BL and the sub bit line /BL are sensed as a core voltage Vcore level and a ground voltage VSS level, respectively.

The voltage levels of the pair of bit lines BL and /BL, shown as dotted lines (F), represent the variation in the voltage levels of the pair of bit lines BL and /BL during the normal operation, and the solid lines (G) represent the variation in the voltage levels of the pair of bit lines BL and /BL during the refresh operation.

In the refresh operation, when the active command act is enabled and then a word line WL is enabled, the bit line sensing operation starts. In this case, the initial voltage difference dV between the pair of bit lines BL and /BL in the refresh operation is smaller than that during a normal operation. In order to solve this problem, in the refresh operation, the enable point of the SB enable signal SB_enb is delayed by a predetermined amount of time and the enable point of the RTO enable signal RTO_enb is delayed more than the enable point of the SB enable signal SB_enb. The delay time of the enable point of the RTO enable signal RTO_enb is determined by the third delay element DLY3 of the second delay section 340. Since the enable point of the SB enable signal SB_enb is delayed, it is possible to ensure there is a sufficient initial voltage difference dV for the bit line sensing process. Further, since the RTO enable signal RTO_enb is enabled when a predetermined time elapses after the SB enable signal SB_enb is enabled, it is possible to further sufficiently ensure the initial potential difference dV for the bit line sensing process. Then, after a predetermined time elapses, when the precharge command pcg is enabled, the pair of bit lines BL and /BL are precharged to have the voltage level of Vcore/2. In FIG. 9, the bit line sensing process for only one period is illustrated.

As described above, in the refresh mode in which the driving power of a sense amplifier is lowered, if the enable point of the sense amplifier control signal is delayed, it is possible to ensure a sufficient initial voltage difference dV between the pair of bit lines BL and /BL. The method of delaying both the RTO enable signal and the SB enable signal, the method of delaying only the SB enable signal, and the method of delaying both the RTO enable signal and the SB enable signal and then further delaying the RTO enable signal have been described as embodiments of the method of delaying the enable point of the sense amplifier control signal. The methods reduce the possibility of a malfunction caused by an insufficient initial voltage difference between the pair of bit lines BL and /BL during the refresh operation such that stability of the bit line sensing operation is ensured.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The circuit and method for controlling a sense amplifier of semiconductor memory apparatus described above delay the enable point of the sense amplifier control signal in order to ensure a sufficient initial voltage difference between the pair of bit lines for the bit line sensing process during the refresh operation, thereby preventing a malfunction cased by lack of an operation voltage for the bit line sensing process.

What is claimed is:

1. A circuit for controlling a sense amplifier of a semiconductor memory apparatus, comprising:
    a sense amplifier control unit configured to control an enable point of a sense amplifier control signal according to whether a refresh signal is enabled; and
    a sense amplifier driver configured to generate a sense amplifier driving signal in response to input of the sense amplifier control signal and a bit line equalization signal,
    wherein, the sense amplifier control unit delays the enable point of the sense amplifier control signal more when the refresh signal is enabled, than when the refresh signal is disabled, and then outputs the sense amplifier control signal.

2. The circuit for controlling a sense amplifier of claim 1, wherein the sense amplifier control unit comprises:
    a signal generating section configured to drive, latch, and delay a driving voltage to provide an output signal in response to input of an active command and a precharge command;
    a first delay section configured to delay the output signal of the signal generating section by a predetermined amount of time to produce an output signal; and
    a first switching section configured to select the output signal of the signal generating section or the output signal of the first delay section according to whether the refresh signal is enabled, and to output the selected signal as the sense amplifier control signal.

3. The circuit for controlling a sense amplifier of claim 2, wherein the signal generating section comprises:
    a first transistor having a gate terminal configured to receive the precharge command, a source terminal configured to receive the driving voltage, and a drain terminal coupled with a first node;
    a second transistor having a gate terminal configured to receive the active command, a drain terminal coupled with the first node, and a source terminal that is grounded;
    a latch unit having first and second inverters configured to invert, latch and output a signal transmitted from the first node; and
    a delay element configured to delay the signal output by the latch unit by a predetermined amount of time.

4. The circuit for controlling a sense amplifier of claim 2, wherein the first delay section comprises a delay element configured to delay the output signal of the signal generating section by a predetermined amount of time.

5. The circuit for controlling a sense amplifier of claim 2, wherein the first switching section comprises:
    a first pass gate configured to output the output signal of the signal generating section as the sense amplifier control signal when the refresh signal is disabled; and
    a second pass gate configured to output the output signal of the first delay section when the refresh signal is enabled.

6. The circuit for controlling a sense amplifier of claim 2, wherein the driving voltage is supplied from an external power supply.

7. The circuit for controlling a sense amplifier of claim 2, wherein, the sense amplifier control unit is configured to delay an RTO enable signal when the refresh signal is enabled, so that the RTO enable signal is enabled after the enabling of an SB enable signal, and then output the RTO enable signal and the SB enable signal.

8. The circuit for controlling a sense amplifier of claim 7, wherein the sense amplifier control unit further comprises:
a second delay section configured to delay the sense amplifier control signal by a predetermined amount of time to produce an output signal; and
a second switching section configured to select the sense amplifier control signal or the output signal of the second delay section according to whether the refresh signal is enabled and output the selected signal as the RTO enable signal, and wherein
the sense amplifier control signal is output as the SB enable signal.

9. The circuit for controlling a sense amplifier of claim 7, wherein the RTO enable signal or the SB enable signal is the sense amplifier control signal.

10. The circuit for controlling a sense amplifier of claim 8, wherein the second delay section comprises a delay element configured to delay the sense amplifier control signal by a predetermined amount of time to produce the output signal.

11. The circuit for controlling a sense amplifier of claim 8, wherein the second switching unit comprises:
a first pass gate configured to output the sense amplifier control signal as the RTO enable signal when the refresh signal is disabled; and
a second pass gate configured to output the output signal of the second delay section as the RTO enable signal when the refresh signal is enabled.

12. A circuit for controlling a sense amplifier of a semiconductor memory apparatus, comprising:
a sense amplifier control unit configured to control an enable point of a sense amplifier control signal according to whether a refresh signal is enabled; and
a sense amplifier driver configured to generate a sense amplifier driving signal in response to input of the sense amplifier control signal and a bit line equalization signal,
wherein, the sense amplifier control unit is configured to delay an RTO enable signal when the refresh signal is enabled, so that the RTO enable signal is enabled after the enabling of an SB enable signal, and then output the RTO enable signal and the SB enable signal.

13. The circuit for controlling a sense amplifier of claim 12, wherein the sense amplifier control unit comprises:
a signal generating section configured to drive, latch, and delay a driving voltage in response to the input of an active command and a precharge command and output the result as the SB enable signal;
a delay section configured to delay the SB enable signal by a predetermined is amount of time to produce an output signal; and
a switching section configured to select the SB enable signal or the output signal of the delay section according to whether the refresh signal is enabled, and to output the selected signal as the RTO enable signal.

14. The circuit for controlling a sense amplifier of claim 13, wherein the signal generating section comprises:
a first transistor having a gate terminal configured to receive the precharge command, a source terminal configured to receive the driving voltage, and a drain terminal coupled with a first node;
a second transistor having a gate terminal configured to receive the active command, a drain terminal coupled with the first node, and a source terminal that is grounded;
a latch unit having first and second inverters configured to invert, latch and output a signal transmitted from the first node; and
a delay element configured to delay the signal output by the latch unit by a predetermined amount of time.

15. The circuit for controlling a sense amplifier of claim 13, wherein the delay section comprises a delay element configured to delay the SB enable signal by a predetermined amount of time.

16. The circuit for controlling a sense amplifier of claim 13, wherein the switching section comprises:
a first pass gate configured to output the SB enable signal as the RTO enable signal when the refresh signal is disabled; and
a second pass gate configured to output the output signal of the delay section as the RTO enable signal when the refresh signal is enabled.

17. The circuit for controlling a sense amplifier of claim 13, wherein the driving voltage is supplied from an external power supply.

18. The circuit for controlling a sense amplifier of claim 12, wherein the RTO enable signal or the SB enable signal is the sense amplifier control signal.

19. A method of controlling a sense amplifier of a semiconductor memory apparatus, comprising:
controlling an enable point of a sense amplifier control signal according to whether a refresh signal is enabled; and
generating a sense amplifier driving signal in response to input of the sense amplifier control signal and a bit line equalization signal,
wherein the controlling of the enable point of the sense amplifier control signal comprises delaying the enable point of the sense amplifier control signal more when the refresh signal is enabled than when the refresh signal is disabled and outputting the sense amplifier control signal.

20. The method of controlling a sense amplifier of a semiconductor memory apparatus of claim 19,
wherein the controlling of the enable point of the sense amplifier control signal comprises:
driving, latching, and delaying a driving voltage in response to the input of an active command and a precharge command to produce a first output signal;
delaying the first output signal of the driving, latching, and delaying of the driving voltage by a predetermined amount of time to produce a second output signal; and
selecting the first output signal of the driving, latching, and delaying of the driving voltage or the second output signal of the delaying of the first output signal according to whether the refresh signal is enabled, and outputting the selected signal as the sense amplifier control signal.

21. The method of controlling a sense amplifier of a semiconductor memory apparatus of claim 20,
further comprising supplying the driving voltage from an external power supply.

22. The method of controlling a sense amplifier of a semiconductor memory apparatus of claim 19,
wherein, when the refresh signal is enabled, the controlling of the enable point of the sense amplifier control signal comprising delaying an enable point of an RTO enable signal more than an enable point of an SB enable signal, and then outputting the RTO enable signal and the SB enable signal.

23. The method of controlling a sense amplifier of a semiconductor memory apparatus of claim 22,
wherein the controlling of the enable point of the sense amplifier control signal further comprises:
delaying the sense amplifier control signal by a predetermined amount of time to produce an output signal; and
selecting the sense amplifier control signal or the output signal of the delaying of the sense amplifier control signal according to whether the refresh signal is enabled and outputting the selected signal as the RTO enable signal, and wherein
the sense amplifier control signal is output as the SB enable signal.

24. The method of controlling a sense amplifier of a semiconductor memory apparatus of claim 22,
wherein the RTO enable signal or the SB enable signal is the sense amplifier control signal.

25. A method of controlling a sense amplifier of a semiconductor memory apparatus, comprising:
controlling an enable point of a sense amplifier control signal according to whether a refresh signal is enabled; and
generating a sense amplifier driving signal in response to input of the sense amplifier control signal and a bit line equalization signal,
wherein the controlling of the enable point of the sense amplifier control signal comprises delaying the enable point of an RTO enable signal more than the enable point of an SB enable signal when the refresh signal is enabled.

26. The method of controlling a sense amplifier of a semiconductor memory apparatus of claim 25,
wherein the RTO enable signal or the SB enable signal is the sense amplifier control signal.

27. The method of controlling a sense amplifier of a semiconductor memory apparatus of claim 25,
wherein the controlling of the enable point of the sense amplifier control signal comprises:
driving, latching, and delaying the driving voltage in response to the input of an active command and a precharge command and then outputting a result as the SB enable signal;
delaying the SB enable signal by a predetermined amount of time to produce an output signal; and
selecting the SB enable signal or the output signal of the delaying of the SB enable signal according to whether the refresh signal is enabled, and outputting the selected signal as the RTO enable signal.

28. The method of controlling a sense amplifier of a semiconductor memory apparatus of claim 27,
further comprising supplying the driving voltage from an external power supply.

* * * * *